(12) United States Patent
Jeon

(10) Patent No.: US 6,815,985 B2
(45) Date of Patent: Nov. 9, 2004

(54) CLOCK DIVIDER AND METHOD FOR DIVIDING A CLOCK SIGNAL IN A DLL CIRCUIT

(75) Inventor: Young-Jin Jeon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,268

(22) Filed: Dec. 30, 2002

(65) Prior Publication Data

US 2004/0000934 A1 Jan. 1, 2004

(30) Foreign Application Priority Data

Jun. 28, 2002 (KR) .............................. 10-2002-0036634

(51) Int. Cl.[7] .............................................. H03K 21/00
(52) U.S. Cl. ........................................ 327/115; 327/117
(58) Field of Search ................................ 327/115, 117, 327/113, 114; 377/47, 118, 27

(56) References Cited

U.S. PATENT DOCUMENTS

| | | | | |
|---|---|---|---|---|
| 4,504,800 A | * | 3/1985 | Plouviez | 331/1 A |
| 5,389,826 A | * | 2/1995 | Sonobe | 307/125 |
| 5,506,529 A | * | 4/1996 | Baldwin | 327/113 |
| 5,955,904 A | | 9/1999 | Kawasaki | 327/156 |
| 5,995,441 A | | 11/1999 | Kato et al. | 365/233 |
| 6,144,713 A | | 11/2000 | Eto | 375/375 |
| 6,194,916 B1 | | 2/2001 | Nishimura et al. | 327/12 |
| 6,212,126 B1 | | 4/2001 | Sakamoto | 365/233 |
| 6,255,870 B1 | | 7/2001 | Na | 327/149 |
| 6,259,288 B1 | | 7/2001 | Nishimura | 327/156 |
| 6,304,117 B1 | | 10/2001 | Yamazaki et al. | 327/158 |
| 6,583,674 B2 | * | 6/2003 | Melava et al. | 331/16 |
| 2001/0028266 A1 | | 10/2001 | Taniguchi | 327/276 |

FOREIGN PATENT DOCUMENTS

| | | |
|---|---|---|
| JP | 10-171774 | 6/1998 |
| JP | 10-209857 | 8/1998 |
| JP | 11-072540 | 3/1999 |
| JP | 11-186903 | 7/1999 |
| JP | 2000-100163 | 4/2000 |
| JP | 2000-339055 | 12/2000 |
| JP | 2001-005554 | 1/2001 |
| JP | 2001-126474 | 5/2001 |
| JP | 2001-236783 | 8/2001 |

* cited by examiner

*Primary Examiner*—Timothy P. Callahan
*Assistant Examiner*—Cassandra Cox
(74) *Attorney, Agent, or Firm*—Marshall, Gerstein & Borun LLP

(57) ABSTRACT

A clock divider in a DLL circuit for generating an internal clock signal synchronized with an external clock signal includes; a first clock dividing circuit for generating a first signal clock by dividing an input clock signal having a same period as a period of the external clock signal, a second clock dividing circuit for generating both a second clock signal and a third clock signal by dividing the first clock signal, a selection signal generation circuit for generating a selection signal in response to plurality of control signals, and a clock signal selection circuit for selectively outputting the second clock signal or the third clock signal in response to the selection signal.

10 Claims, 12 Drawing Sheets

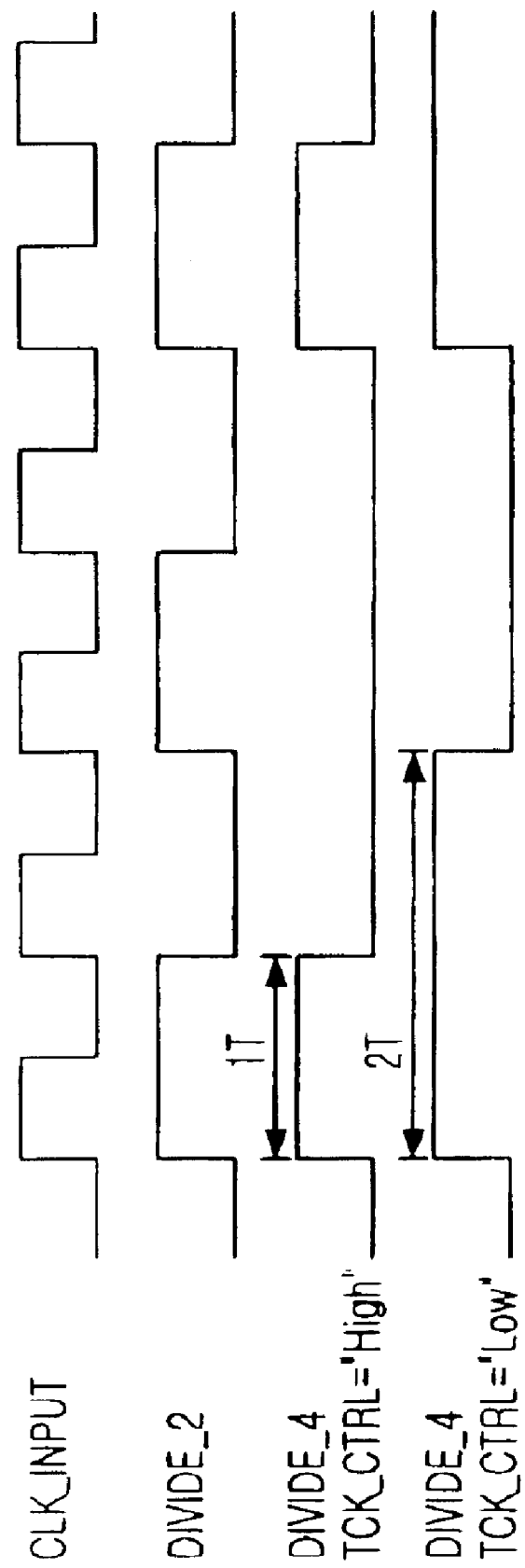

CLOCK DIVIDER AND METHOD FOR DIVIDING A CLOCK SIGNAL IN A DLL CIRCUIT

TECHNICAL FIELD

A clock divider and a method for dividing a clock signal in a DLL circuit of a semiconductor memory device are disclosed.

DESCRIPTION OF THE RELATED ART

Generally, clock signals are used as reference signals to set operation timing in a system or a circuit, and to ensure high-speed operation of the system or circuit without any errors. When a clock signal from an external circuit is used internally within a circuit, a time delay, i.e., a clock skew may be generated due to the internal circuit. A delay locked loop (DLL) circuit may be used to ensure that the internal clock signal of the circuit has the same phase as the external clock signal by compensating for the clock skew.

Important characteristics of a DLL circuit include small size, low jitter, and fast locking time. These characteristics may require semiconductor memory devices of the future, which may also require low power consumption and high-speed operation. A DLL circuit is less influenced by noise than a phase locked loop (PLL) circuit. As a result, a DLL circuit may be used in a synchronous semiconductor memory device, such as, for example, a DDR SDRAM (double data rate synchronous DRAM) or the like. A DLL circuit of a register type is frequently used in many kinds of DLL circuits.

FIG. 1 is a block diagram illustrating a conventional resister-control-type DLL circuit of a typical DDR SDRAM.

The conventional register-control-type DLL circuit of the typical DDR SDRAM includes a clock buffer 110, a first clock divider 130, a delay circuit 150, a clock multiplexer 170, a second clock divider 190, a delay model 210, a phase comparator 230, and a delay controller 250.

The clock buffer 110 converts a voltage level of a high frequency external clock signal CLK and a high frequency external clock inversion signal CLKB, both of which are supplied from an external circuit, into a power supply voltage level VDD. The first clock divider 130 outputs a low frequency reference clock signal by dividing a high frequency clock signal CLKD of a VDD level by n, wherein n is a positive integer, (e.g., n is 4). The delay circuit 150 delays the high frequency clock signal CLKD of the VDD level a predetermined delay amount and outputs a delayed clock signal to the clock multiplexer 170. The delay circuit 150 includes a plurality of delay units forming a delay chain and a shift register for controlling the plurality of delay units. Each delay unit includes a NAND gate and an inverter. The clock multiplexer 170 outputs the delayed clock signal OUTPUT DLL_CLK to an external circuit and to the second clock divider 190. The second clock divider 190 divides the delayed clock signal from the clock multiplexer 170 by n, wherein n is a positive integer (e.g., n is 4). The delay model 210 is configured so that a feedback signal has an identical delay condition as the real clock signal path.

The phase comparator 230 compares the phase of the internal feedback signal outputted from the delay model 210 with the phase of the reference clock signal REF. The delay controller 250 outputs shift control signals SR and SL for controlling a shift direction of the shift register in the delayed circuit 150 and a delay locking signal representing that delay locking is achieved in response to control signals EARLY and LATE outputted from the phase comparator 230.

The delay model 210, also called a replica circuit, includes a dummy clock buffer, a dummy output buffer, and a dummy load. A delay time of the delay model 210 is generated that is identical to a delay time generated in the real clock signal path. Because of the delay circuit 150, the delay controller 250, and the phase comparator 230 delay the external clock signal CLK a desired delay amount, they are called a delay unit.

Because the delay model 210 includes a dummy clock buffer, a dummy output buffer and a dummy load, a delay time of the clock signal generated from the delay model 210 can be compensated. At this time, since the external clock signal is not synchronized with the internal clock signal, the delay operation for synchronizing the external clock signal with the internal clock signal is repeated in the delay circuit 150. Since the delay amount of the delay model 210 cannot be changed to achieve locking, the total delay amount has to be adjusted in the delay circuit 150. A condition for achieving locking is as follows:

$$DD+RR=nT \quad \text{(Eq. 1)}$$

Where, DD is a delay amount of the delay circuit 150, RR is a delay amount of the delay model 210, T is a period of the external clock signal, and n is an integer, e.g., 1 or 2.

$$DD=nT-RR \quad \text{(Eq. 2)}$$

Accordingly, an output DLL clock signal OUTPUT_DLL_CLK is provided by repeatedly delaying the high frequency clock signal CLKD by as much as DD, which is the delay amount that is repeatedly adjusted in the delay circuit 150. Additionally, a negative delay that precedes the external clock signal by as much as RR may be achieved in the DLL circuit.

FIG. 2A is a timing diagram illustrating one period (1T) based dividing of a clock signal capable of being used in a low frequency band. FIG. 2B is a timing diagram illustrating two periods (2T) based dividing of a clock signal capable of being used in a high frequency band.

Referring to FIG. 2A, since a rising edge of the feedback clock signal, which is compared to the reference clock signal REF in the phase comparator 230 in the low frequency band, is before the rising edge of the reference clock signal REF, locking can be achieved by repeatedly increasing the delay amount in the delay circuit 150. In this case, because the pulse width of the divided reference clock signal REF corresponds to one period of the external clock signal CLK, it is called one-period-based dividing or 1T-based dividing.

Referring to FIG. 2B, since a rising edge of the feedback clock signal, which is compared to the reference clock signal REF in the phase comparator 230 in the high frequency band, is before the rising edge of the reference clock signal REF, locking can be achieved by repeatedly increasing the delay amount in the delay circuit 150. Accordingly, because the pulse width of the divided reference clock signal REF corresponds to two periods of the external clock signal CLK, locking can be achieved. Additionally, because the pulse width of the divided reference clock signal REF corresponds to two periods of the external clock signal CLK, it is called two-periods-based dividing or 2T-based dividing.

FIG. 3A is a circuit diagram illustrating a conventional four-dividing circuit for one-period-based dividing of a clock signal in which the pulse width of the divided reference clock signal REF is not adjustable. The four-dividing circuit may be located in the clock dividers, e.g. the the first clock divider 130 and the second clock divider 190, according to the prior art. FIG. 3B is a timing diagram showing the operation of the conventional four-dividing circuit of FIG. 3A.

If the clock signal CLKD from the clock buffer 110 is provided as an input to the first dividing unit 310 in response to a DLL enable signal DLL_ENABLE, the clock signal CLKD is divided by two and a two-divided clock signal DIVIDE_2 is outputted. Thereafter, if the two-divided clock signal DIVIDE_2 is provided as an input to a second dividing unit 330, the two-divided clock signal is divided again by two and a four-divided clock signal DIVIDE_4 is outputted. The four-divided clock signal is maintained in a high state for one period of the externally supplied clock signal CLKD and then is maintained in a low state.

FIG. 4A is a circuit diagram illustrating a conventional four-dividing circuit for one-period-based dividing in which the pulse width of the divided reference clock signal REF is adjustable. The four-dividing circuit may be located in the clock dividers, e.g., the first clock divider 130 and the second clock divider 190, according to the prior art. FIG. 4B is a timing diagram showing the operation of the conventional four-dividing circuit of FIG. 4A.

If the clock signal CLKD from the clock buffer 110 is provided as an input to a third dividing unit 410 in response to a DLL enable signal DLL_ENABLE, the clock signal CLKD is divided by two and a two-divided clock signal DIVIDE_2 is outputted. Thereafter, if the two-divided clock signal DIVIDE_2 is provided as an input to a fourth dividing unit 430, the two-divided clock signal DIVIDE_2 is divided by 2 and a four-divided clock signal is outputted. The four-divided clock signal DIVIDE_4 of the fourth dividing unit 430 is maintained in a high state for two periods of the externally supplied clock signal CLKD and then is maintained in a low state.

As shown in the timing diagrams in FIGS. 3B and 4B, the pulse width of the divided reference clock signal REF can be changed based on the frequency bands.

Currently, when the externally supplied input clock signal is a high frequency signal, the two-periods-based dividing is carried out to secure correct operation in the high frequency band. Even if two-periods-based dividing results in good performance in the high frequency band, noise may be generated in the low frequency band. As a result, malfunctions of the semiconductor memory device may frequently occur in the low frequency band.

Additionally, when one-period-based dividing is carried out to reduce noise, it is difficult for operating frequencies to become greater than 100 MHz to 133 MHz. Moreover, the size of the semiconductor memory device is increased due to the numerous delay circuits.

SUMMARY OF THE DISCLOSURE

A clock divider capable of reducing jitter due to noise associated with an external power supply voltage and that reduces the size of the DLL circuit is disclosed. Additionally, a method for dividing a clock signal in a DLL circuit of a semiconductor memory device is also disclosed.

A clock divider in a DLL circuit for generating an internal clock signal synchronized with an external clock signal in a semiconductor memory device includes: a first clock dividing circuit for generating a first clock signal by dividing an input clock signal having a same period as a period of the external clock signal; a second clock dividing circuit for generating both a second clock signal and a third clock signal by dividing the first clock signal from the first clock dividing circuit; a selection signal generation circuit for generating a selection signal in response to a plurality of control signals; and a clock signal selection circuit for selectively outputting the second clock signal or the third clock signal in response to the selection signal; wherein one period of the first clock signal corresponds to two periods of the input clock signal; and wherein the second clock signal is a one-period-based dividing clock signal in which one period of the one-period-based dividing clock signal corresponds to four periods of the input clock signal, the one-period-based dividing clock signal being maintained in a first logic state for one period of the input clock signal and being maintained in a second logic state for three periods of the input clock signal.

A method for dividing an input clock signal of a DLL circuit in a semiconductor memory device is disclosed, the DLL circuit being used to generate an internal clock signal synchronized with an external clock signal. The method includes: generating a first clock signal by dividing the input clock signal, which has a same period as a period of the external clock signal; generating both a second clock signal and a third clock signal by dividing the first clock signal; generating a selection signal by receiving: a long locking signal that is generated when a high frequency clock signal is provided as an input to the DLL circuit, a DLL enable signal that is generated when the DLL circuit is enabled, and a dividing clock selection enable signal that is in a logic high state for an initial four cycles after the DLL circuit is turned on; and selectively outputting the second clock signal associated with the high frequency clock signal or outputting the third clock signal associated with a low frequency clock signal in response to the selection signal.

BRIEF DESCRIPTION OF THE DRAWINGS

The above and other features of the disclosed clock divider and method will become apparent from the following description of preferred embodiments taken in conjunction with the accompanying drawings, wherein:

FIG. 6B is a timing diagram illustrating the operation of the four-dividing clock divider of FIG. 6A;

DETAILED DESCRIPTION OF THE PRESENTLY PREFERRED EMBODIMENTS

A clock divider of a DLL circuit, which is capable of adjusting the pulse width of a clock signal, will be described in detail referring to the accompanying drawings.

Figure 5:
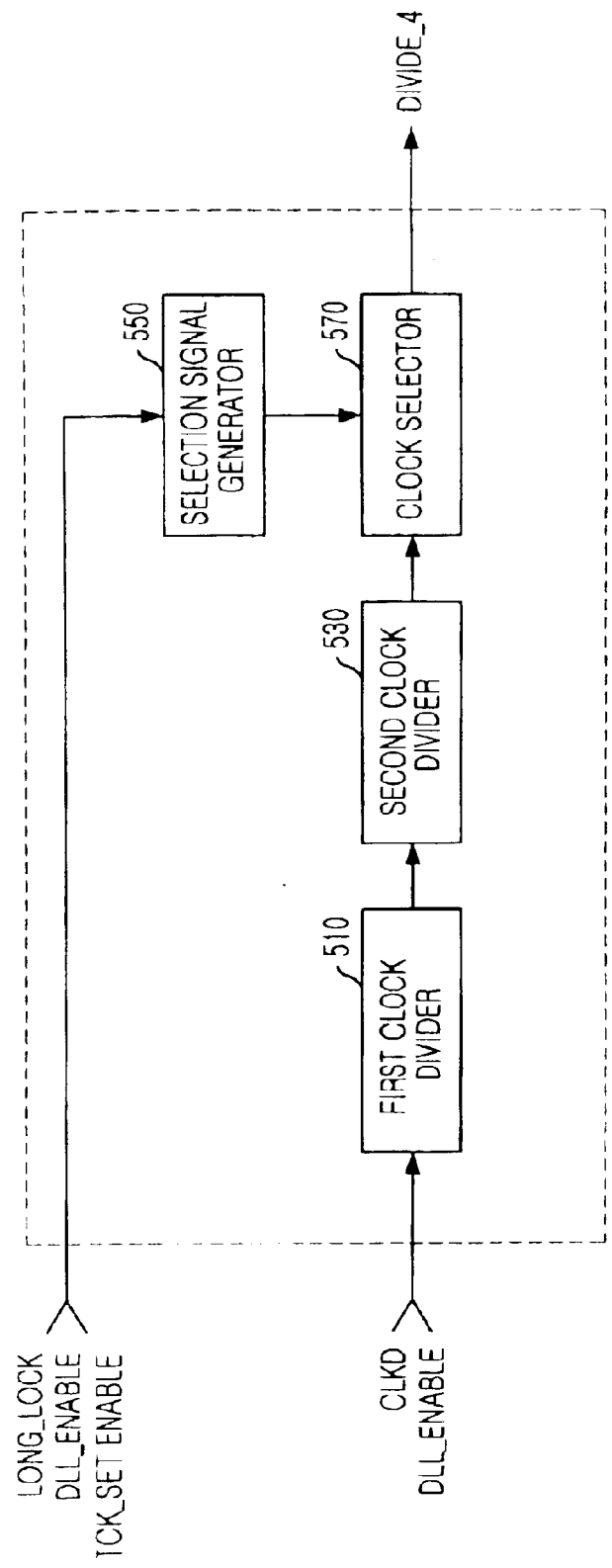
FIG. 5 is a block diagram illustrating a four-dividing clock divider capable of adjusting the pulse width of a clock signal.

FIG. 5 is a block diagram illustrating a four-dividing clock divider capable of adjusting the pulse width of a clock signal.

The four-dividing clock divider includes a first clock divider 510, a second clock divider 530, a selection signal generator 550, and a clock selector 570. The first clock divider 510 is a two-dividing circuit and generates a first clock signal by receiving an input clock signal CLKD having an identical period with a period of an external clock signal. The first clock signal is a divided clock signal that is generated by the first clock divider 510 by dividing the input clock signal CLKD by 2. The second clock divider 530 generates a 1T-based dividing clock signal and a 2T-based dividing clock signal. The selection signal generator 550 generates a selection signal for selecting one of the 1T-based dividing clock signal and the 2T-based dividing clock signal. The clock selector 570 outputs one of the 1T-based dividing clock signal and the 2T-based dividing clock signal in response to the selection signal.

Figure 1:
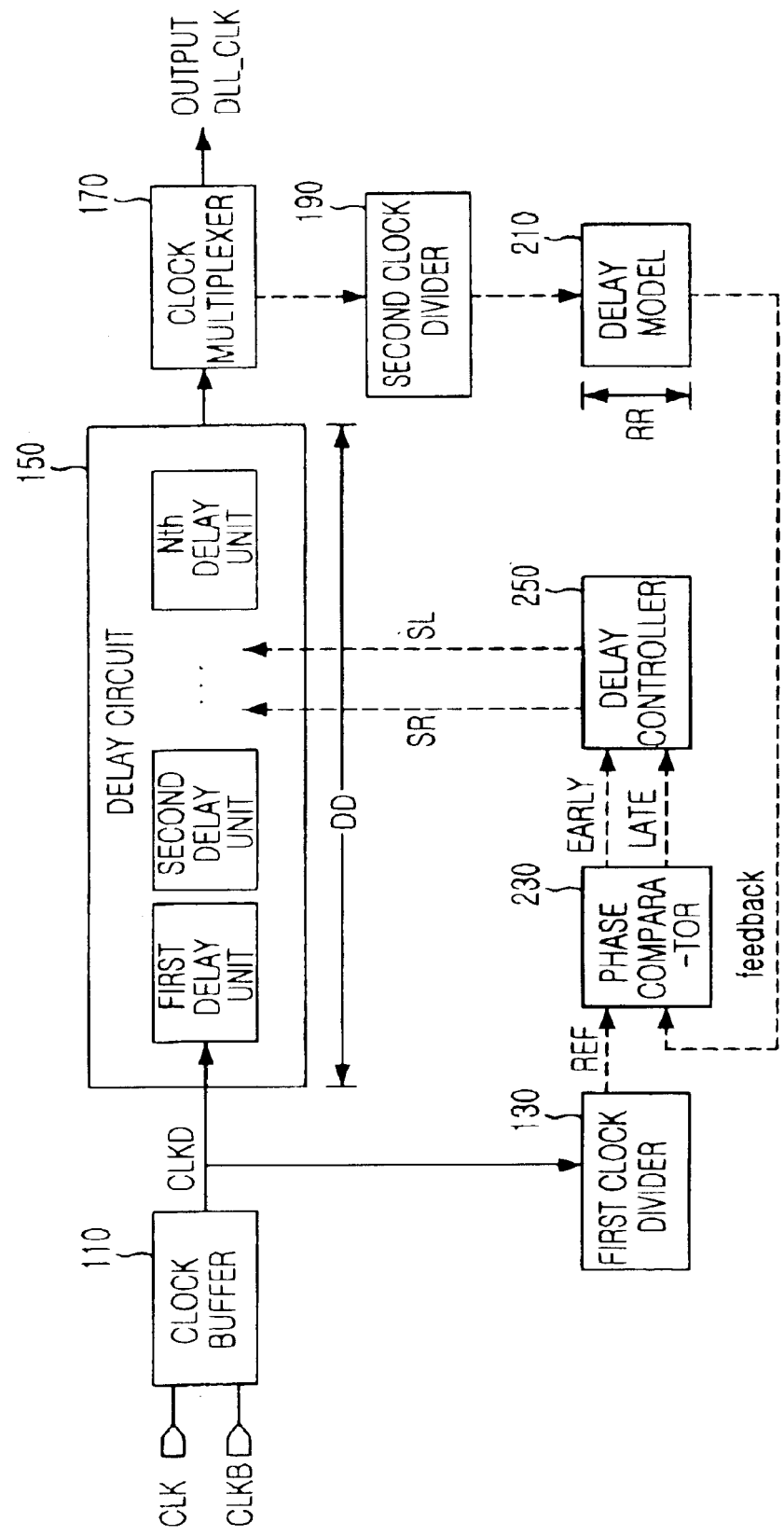
FIG. 1 is a block diagram illustrating a conventional register-control-type DLL circuit of a typical DDR SDRAM.
Figure 2A:
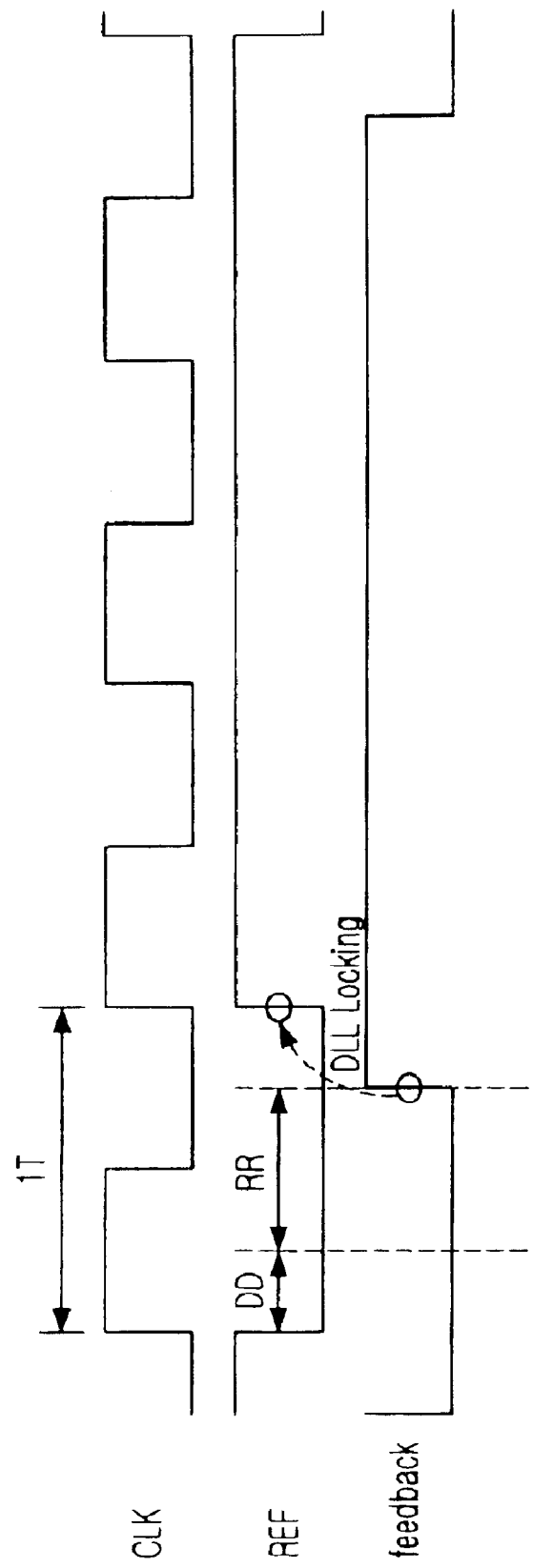
FIG. 2A is a timing diagram illustrating one period (1T) based dividing of a clock signal capable of being used in a low frequency band.
Figure 2B:
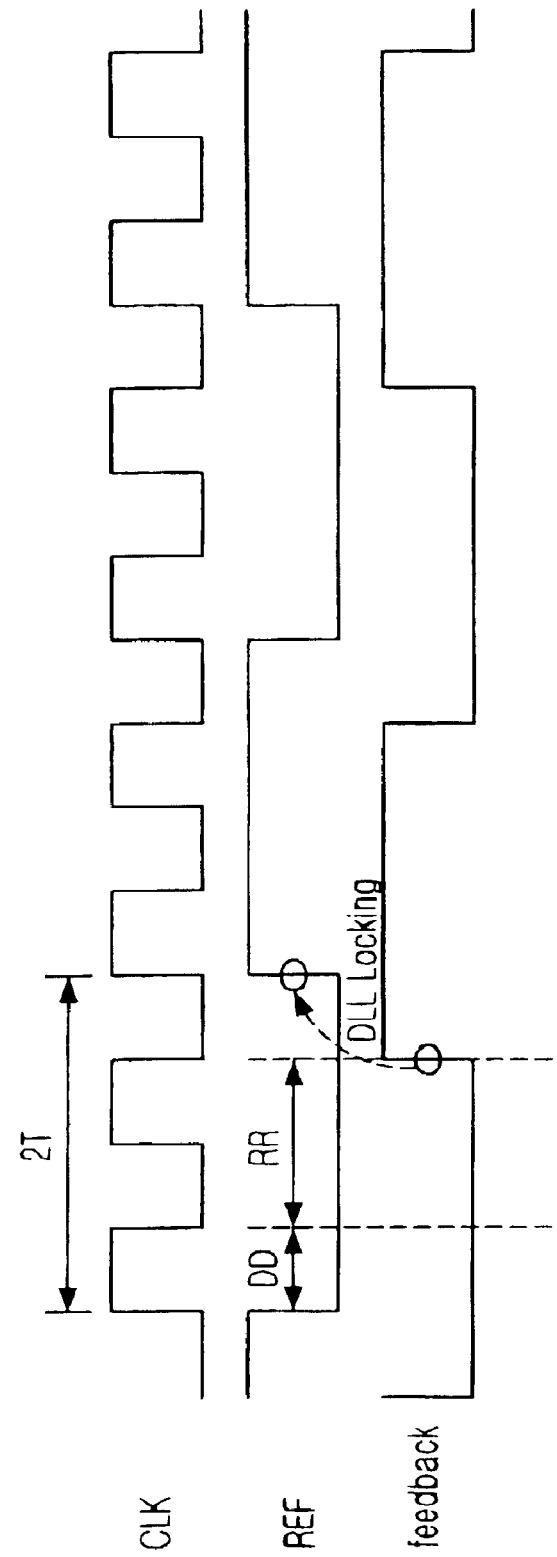
FIG. 2B is a timing diagram illustrating two periods (2T) based dividing of a clock signal capable of being used in a high frequency band.
Figure 3A:
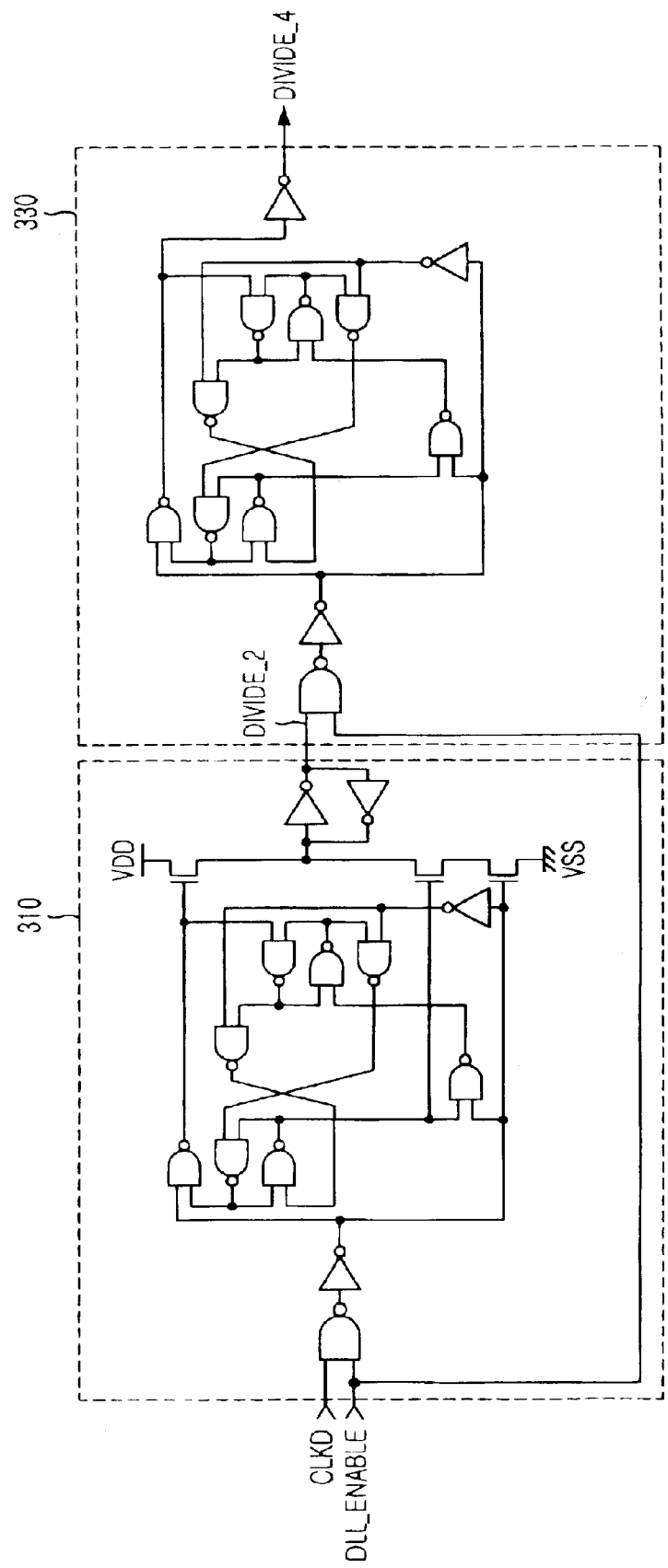
FIG. 3A is a circuit diagram illustrating a conventional four-dividing circuit for one-period-based dividing of a clock signal.
Figure 3B:
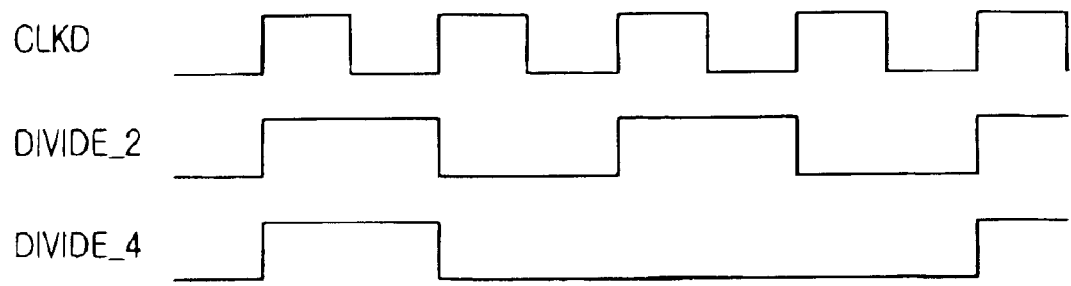
FIG. 3B is a timing diagram showing the operation of the conventional four-dividing circuit of FIG. 3A.
Figure 4A:
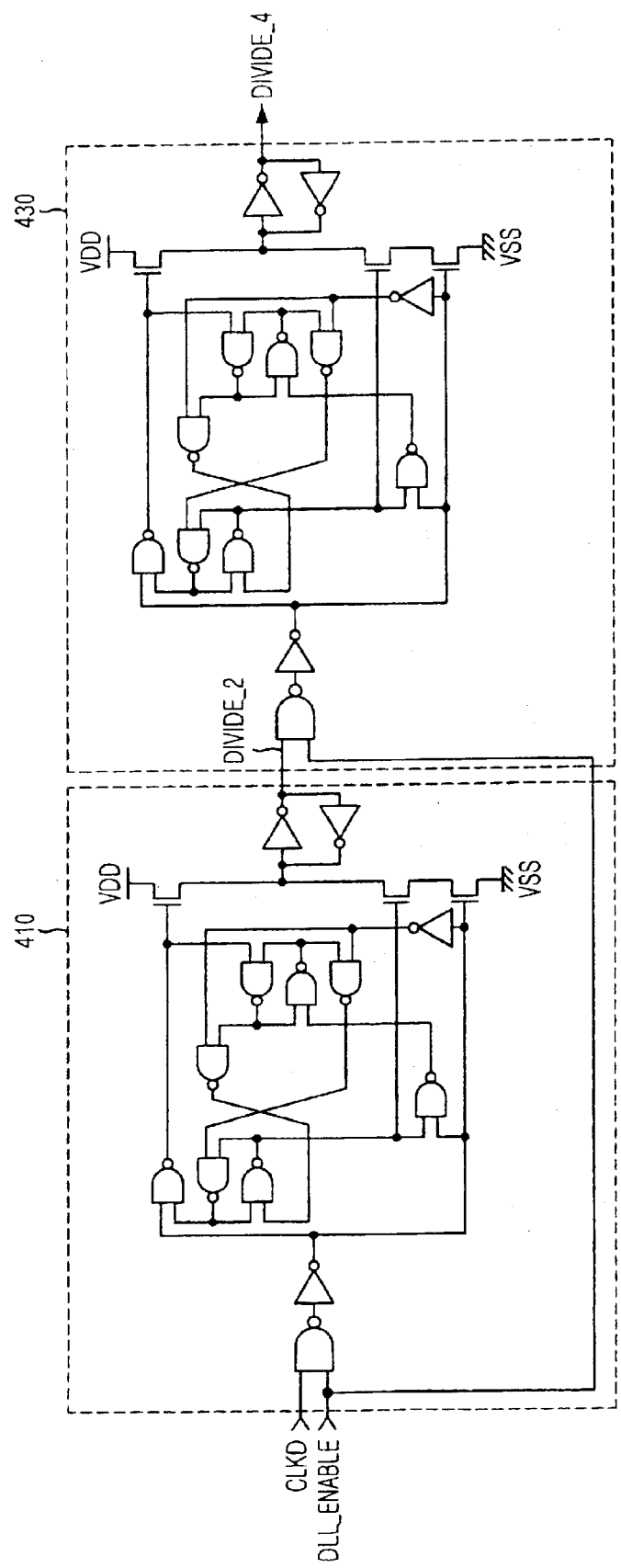
FIG. 4A is a circuit diagram illustrating another conventional four-dividing circuit for one-period-based dividing of a clock signal.
Figure 4B:
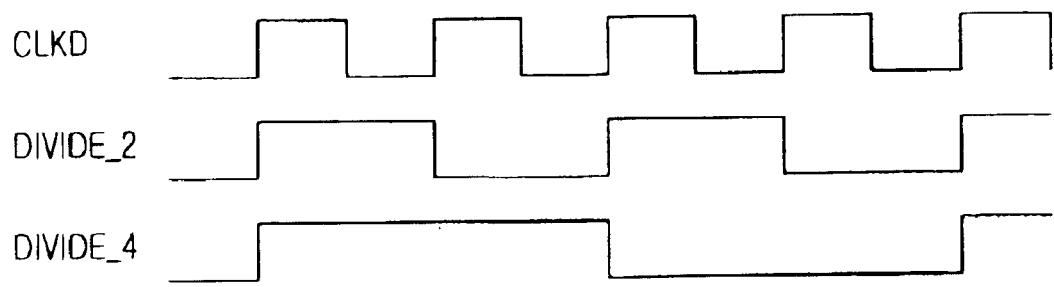
FIG. 4B is a timing diagram showing the operation of the conventional four-dividing circuit of FIG. 4A.

It should be understood that the four-dividing clock divider can be applied to the first clock divider 130 and the second clock 190 of FIG. 1. An example in which the four-dividing clock divider is applied to the first clock divider 510 of FIG. 5 will be described.

The first clock divider 510 receives the input clock signal CLKD having an identical period as a period of the external clock signal and generates a two-divided clock signal. The two-divided clock signal is maintained in a first logic state for one period of the input clock signal CLKD and is maintained in a second logic state for one period of the input clock signal CLKD.

The second clock divider 530 receives the two-divided clock signal and generates the 1T-based dividing clock signal and the 2T-based dividing clock signal. The 1T-based dividing clock signal is maintained in a first logic state for one period of the input clock signal CLKD and is maintained in a second logic state for three periods of the input clock signal CLKD. The 2T-based dividing clock signal is maintained in a first logic state for two periods of the input clock signal CLKD and is maintained in a second logic state for two periods of the input clock signal CLKD.

The selection signal generator 550 receives a long locking signal LONG_LOCK, a DLL enable signal DLL_ENABLE and a dividing clock selection enable signal TCK_SET ENABLE, and generates the selection signal for selecting one of the 1T-based dividing clock signal and the 2T-based dividing clock signal according to the frequency of the external clock signal. The clock selector 570 selectively outputs one of the 1T-based dividing clock signal and the 2T-based dividing clock signal in response to the selection signal.

Figure 6A:
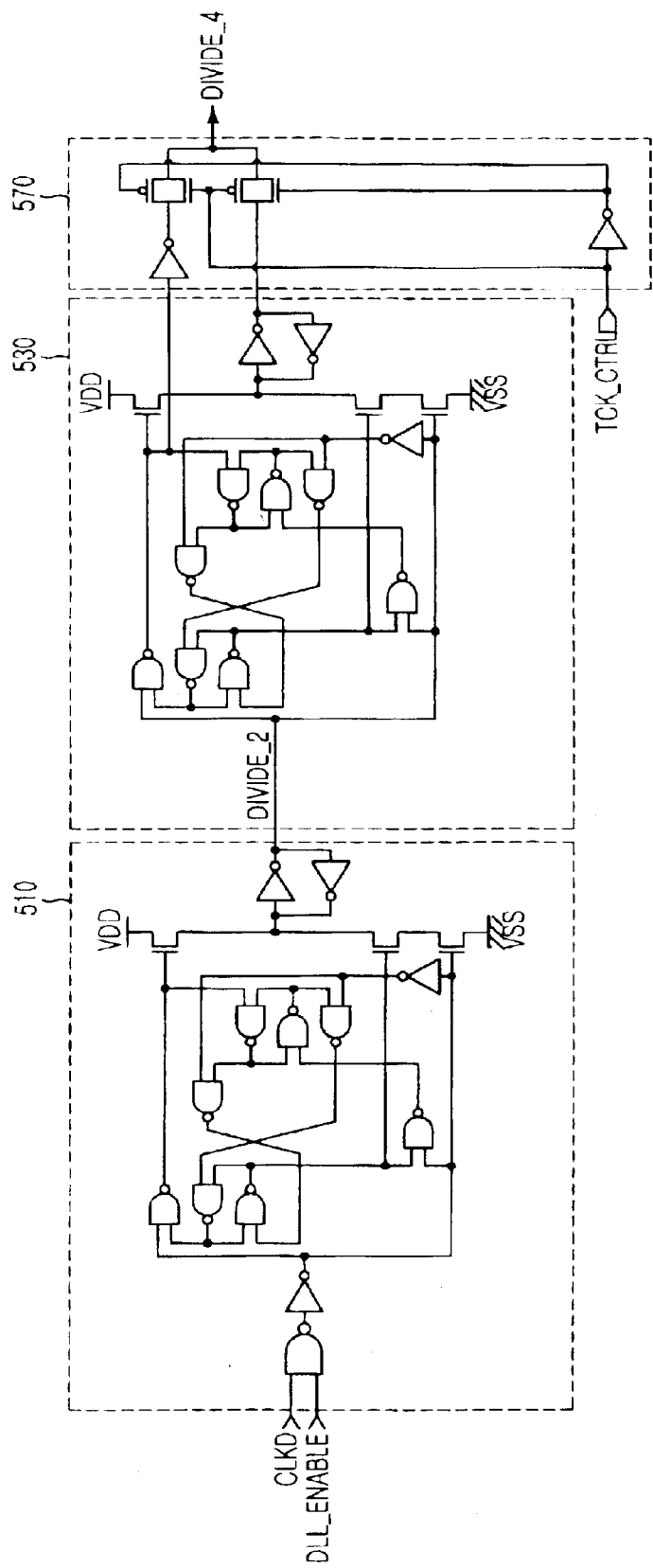
FIG. 6A is a circuit diagram illustrating a four-dividing clock divider capable of adjusting the pulse width of a clock signal.

FIG. 6A is a circuit diagram illustrating a four-dividing clock divider capable of adjusting the pulse width of a clock signal in accordance with a preferred embodiment.

The first clock divider 510 receives the input clock signal CLKD and the DLL enable signal DLL_ENABLE and outputs the two-divided clock signal DIVIDE_2. The second clock divider 530 receives the two-divided clock signal DIVIDE_2 and generates the 1T-based dividing clock signal and the 2T-based dividing clock signal, both of which correspond to the four-divided clock signal. The 1T-based dividing clock signal or the 2T-based dividing clock signal generated from the second clock divider 530 is selectively outputted through the clock selector 570 in response to the selection signal TCK_CTRL generated from the selection signal generator 550. of FIG. 5.

FIG 6B is a timing diagram illustrating the operation of the four-dividing clock divider of FIG. 6A.

When the selection signal TCK_CTRL is maintained in a logic high state, the 1T-based dividing clock signal is outputted and when the selection signal TCK_CTRL is maintained in a logic low state; the 2T-based dividing clock signal is outputted.

Figure 7:
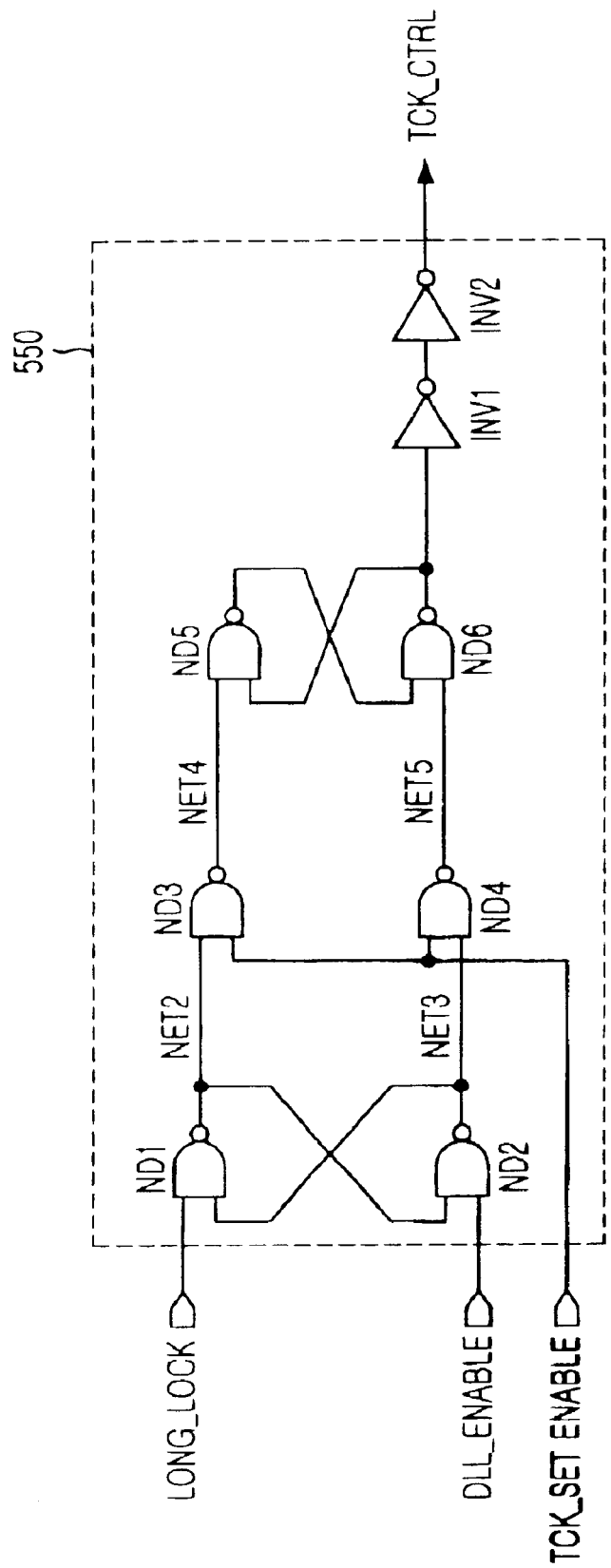
FIG. 7 is a circuit diagram illustrating the selection signal generator of FIG. 5.

FIG. 7 is a circuit diagram illustrating the selection signal generator 550 of FIG. 5.

As illustrated in FIG. 7, the selection signal generator 550 receives the long locking signal LONG_LOCK, the DLL enable signal DLL_ENABLE and the dividing clock selection enable signal TCK_SET ENABLE, and generates the selection signal TCK_CTRL. The long locking signal LONG_LOCK is a deactivated signal that is outputted from the phase comparator 230 of FIG. 1 when the delay amount DD+RR of Eq. 1 becomes greater than one period of the external clock signal. The DLL enable signal DLL_ENABLE is generated when the DLL circuit is enabled. The dividing clock selection enable signal TCK_SET ENABLE is maintained in a logic high state for the initial four cycles after the DLL circuit is turned on. Because the dividing clock selection enable signal TCK_SET ENABLE may be easily generated by using a D flip/flop and a latch located inside or outside of the DLL circuit, a circuit for generating the dividing clock selection enable signal TCK_SET ENABLE is not described.

When the dividing clock selection enable signal TCK_SET ENABLE is in a logic high state, the selection signal generator 550 determines whether the selection signal TCK_CTRL is in a logic high state or in a logic low state.

Since the delay amount DD+RR of Eq. 1 is greater than one period of the external clock signal in a high frequency band, the long locking signal LONG_LOCK is generated by the phase comparator 230 of FIG. 1. If the long locking signal LONG_LOCK is enabled in a logic low state, the output NET2 of a first NAND gate ND1 becomes a logic high state. Since the dividing clock selection enable signal TCK_SET ENABLE becomes a logic high state for initial four cycles after the DLL circuit is turned on, the output NET4 of a third NAND gate ND3 becomes a logic low state. Since the DLL enable signal DLL_ENABLE and the dividing clock selection enable signal TCK_SET ENABLE are in a logic high state, the output NET3 of a second NAND gate ND2 becomes a logic low state and the output NET5 of a fourth NAND gate ND4 becomes a logic high state. Since the output of a fifth NAND gate ND5 becomes a logic high state by receiving the output NET4 in a logic low state, the output of a sixth NAND gate ND6 becomes a logic low state. Therefore, the selection signal TCK_CTRL is generated in a logic low state through inverters INV1 and INV2.

Since the delay amount DD+RR of Eq. 1 is less than one period of the external clock signal in a low frequency band, the long locking signal LONG_LOCK is not generated by the phase comparator 230 of FIG. 1. If the long locking signal LONG_LOCK is disabled with in a logic high state, the output NET2 of the first NAND gate ND1 becomes a logic low state. Since the dividing clock selection enable signal TCK_SET ENABLE becomes a logic high state for an initial four cycles after the DLL circuit is turned on, the output NET4 of the third NAND gate ND3 becomes a logic high state. Since the DLL enable signal DLL_ENABLE and the dividing clock selection enable signal TCK_SET ENABLE are in a logic high state, the output NET3 of the second NAND gate ND2 becomes a logic high state, and the output NET5 of the fourth NAND gate ND4 becomes a low state. Since the output of the sixth NAND gate ND6 becomes a logic high state by receiving the output NET5 in a logic low state, the selection signal TCK_CTRL is generated in a logic high state through inverters INV1 and INV2.

Figure 8:
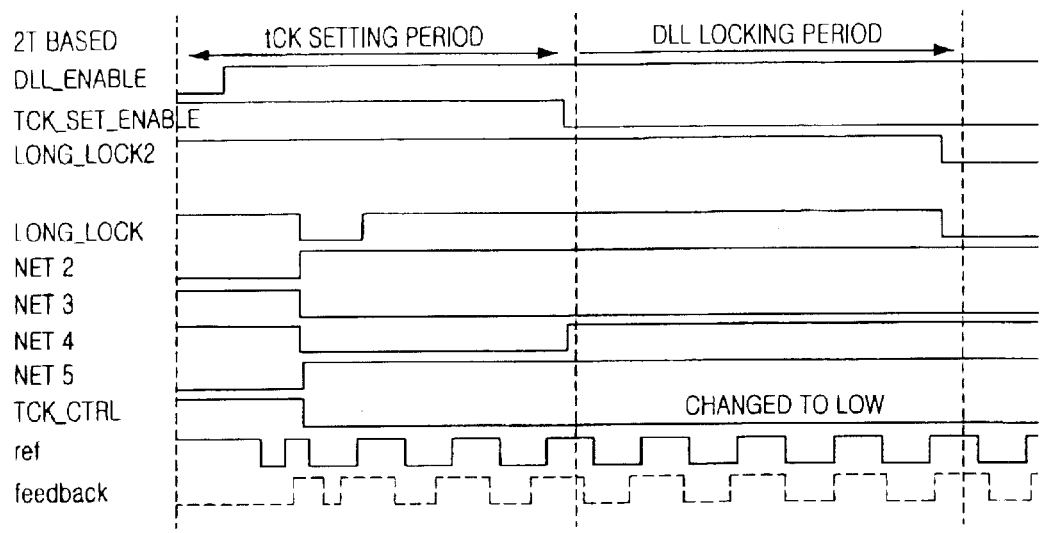
FIG. 8 is a timing diagram showing the operation of the four-dividing clock divider for a high frequency operation.
Figure 9:
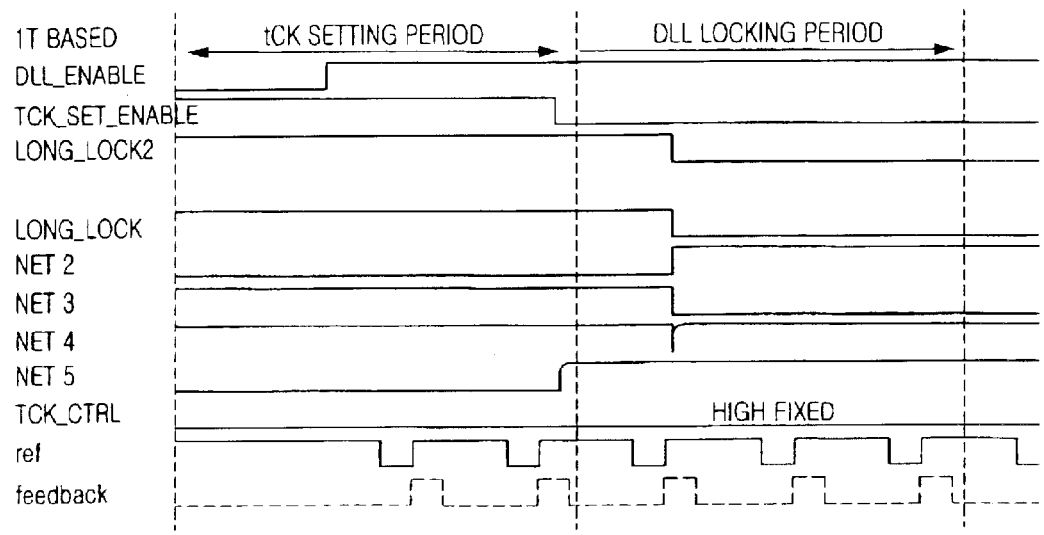
FIG. 9 is a timing diagram showing the operation of the four-dividing clock divider for a low frequency operation.

FIGS. 8 and 9 are timing diagrams showing the operation of the four-dividing clock divider.

FIG. 8 is a timing diagram showing the operation of the four-dividing clock divider for a high frequency operation, and FIG. 9 is a timing diagram showing the operation of the four-dividing clock divider for a low frequency operation.

As shown in FIG. 8, the selection signal TCK_CTRL is transitioned from a logic high state to a logic low state when the long locking signal LONG_LOCK is generated in the high frequency band.

As shown in FIG. 9, the selection signal TCK_CTRL is maintained in a logic high state since the long locking signal LONG_LOCK is not generated in the low frequency band.

In FIGS. 8 and 9, the reference signal is an inverted output signal selectively outputted as the 1T-based dividing clock signal or the 2T-based dividing clock signal from the clock selector 570 in response to the selection signal TCK_CTRL.

Accordingly, since the four-dividing clock divider can be applied over a wide frequency band, the size of the DLL circuit can be reduced. Also, since the four-dividing clock divider is strong for a noise of the external power supply voltage, jitter is reduced by ⅓.

While the disclosed clock divider and method of dividing a clock signal in a DLL circuit have been described with respect to the particular embodiments, it will be apparent to those skilled in the art that various changes and modifications may be made without departing from the spirit and scope of this disclosure, which is limited only by the following claims.

What is claimed is:

1. A clock divider in a DLL circuit for generating an internal clock signal synchronized with an external clock signal, the clock divider comprising:
    a first clock dividing circuit for generating a first clock signal by dividing an input clock signal having a same period as a period of the external clock signal;
    a second clock dividing circuit for generating both a second clock signal and a third clock signal by dividing the first clock signal from the first clock dividing circuit;
    a selection signal generation circuit for generating a selection signal in response to a plurality of control signals; and
    a clock signal selection circuit for selectively outputting the second clock signal or the third clock signal in response to the selection signal;
    wherein one period of the first clock signal corresponds to two periods of the input clock signal; and
    wherein the second clock signal is a one-period-based dividing clock signal in which one period of the one-period-based dividing clock signal corresponds to four periods of the input clock signal, the one-period-based dividing clock signal being maintained in a first logic state for one period of the input clock signal and the one-period-based dividing clock signal being maintained in a second logic state for three periods of the input clock signal.

2. The clock divider as recited in claim 1, wherein the first clock dividing circuit comprises a two-dividing circuit.

3. The clock divider as recited in claim 1, wherein the third clock signal is a two-periods-based dividing clock signal in which one period of the two-periods-based dividing clock signal corresponds to four periods of the input clock signal, the two-periods-based dividing clock signal being maintained in the first logic state for two periods of the input clock signal and the two-periods-based dividing clock signal being maintained in the second logic state for two periods of the input clock signal.

4. The clock divider as recited in claim 3, wherein the plurality of control signals comprises:
    a long locking signal generated when a high frequency clock signal is inputted to the DLL circuit,
    a DLL enable signal generated when the DLL circuit is enabled, and
    a dividing clock selection enable signal that is in the first logic state for an initial four cycles after the DLL circuit is turned on.

5. The clock divider as recited in claim 4, wherein the long locking signal is enabled in the second logic state for the high frequency clock signal and disabled in the first logic state for a low frequency clock signal.

6. The clock divider as recited in claim 5, wherein the clock signal selection circuit outputs the second clock signal in response to the selection signal being in the second logic state, and wherein the clock signal selection circuit outputs the third clock signal in response to the selection signal being in the first logic state.

7. A method for dividing an input clock signal in a DLL circuit, the DLL circuit being used to generate an internal clock signal synchronized with an external clock signal, the method comprising:
    generating a first clock signal by dividing the input clock signal, which has a same period as a period of the external clock signal;
    generating both a second clock signal and a third clock signal by dividing the first clock signal;
    generating a selection signal by receiving:
        a long locking signal that is generated when a high frequency clock signal is provided as an input to the DLL circuit,
        a DLL enable signal that is generated when the DLL circuit is enabled, and
        a dividing clock selection enable signal that is in a logic high state for an initial four cycles after the DLL circuit is turned on; and
    selectively outputting the second clock signal associated with the high frequency clock signal or outputting the third clock signal associated with a low frequency clock signal in response to the selection signal.

8. The method as recited in claim 7, wherein one period of the first clock signal corresponds to two periods of the input clock signal.

9. The method as recited in claim 8, wherein the second clock signal is a one-period-based dividing clock signal in which one period of the one-period-based dividing clock signal corresponds to four periods of the input clock signal, the one-period-based dividing clock signal being maintained in a first logic state for one period of the input clock signal and the one-period-based dividing clock signal being maintained in a second logic state for three periods of the input clock signal.

10. The method as recited in claim 9, wherein the third clock signal is a two-periods-based dividing clock signal in which one period of the two-periods-based dividing clock signal corresponds to four periods of the input clock signal, the two-periods-based dividing clock signal being maintained in the first logic state for two periods of the input clock signal and the two-periods-based dividing clock signal being maintained in the second logic state for two periods of the input clock signal.

* * * * *